United States Patent [19]

Yoshikawa

[11] Patent Number: 4,571,728
[45] Date of Patent: Feb. 18, 1986

[54] TEMPERATURE CONTROL DEVICE FOR A SEMICONDUCTOR LASER

[75] Inventor: Shoji Yoshikawa, Tokyo, Japan

[73] Assignee: Olympus Optical Co., Ltd., Tokyo, Japan

[21] Appl. No.: 753,364

[22] Filed: Jul. 8, 1985

Related U.S. Application Data

[63] Continuation of Ser. No. 481,860, Apr. 4, 1983.

[30] Foreign Application Priority Data

Apr. 9, 1982 [JP] Japan .................................. 57-59019

[51] Int. Cl.⁴ .......................... H01S 3/04; H01S 3/045
[52] U.S. Cl. ......................................... 372/36; 357/87
[58] Field of Search ........................................... 357/87

[56] References Cited

U.S. PATENT DOCUMENTS 4,399,541  8/1983  Kovats et al. ......................... 372/36

FOREIGN PATENT DOCUMENTS 54-53979 of 1979 Japan ..................................... 372/36
55-113390 of 1980 Japan ..................................... 372/36

OTHER PUBLICATIONS

Wittke, et al; RCA Technical Notes; "Stabilization of CW Injection Lasers"; TN No. 1005; Apr. 9, 1975.

Primary Examiner—William L. Sikes
Assistant Examiner—Robert E. Wise
Attorney, Agent, or Firm—Frishauf, Holtz, Goodman & Woodward

[57] ABSTRACT

A temperature control device for a semiconductor laser comprises a temperature sensitive resistor for detecting the temperature of a semiconductor laser and a Peltier element connected to the semiconductor laser and controlled, with regard to the direction of its heat transmission, in accordance with the resistance value of the temperature sensitive resistor. A single power source of a single polarity low voltage is used as a power source for the Peltier element. The current generated from the single polarity power source has its polarity changed by a bridging amplifier controlled by the resistance value of the temperature sensitive resistor and is supplied to the Peltier element.

19 Claims, 2 Drawing Figures

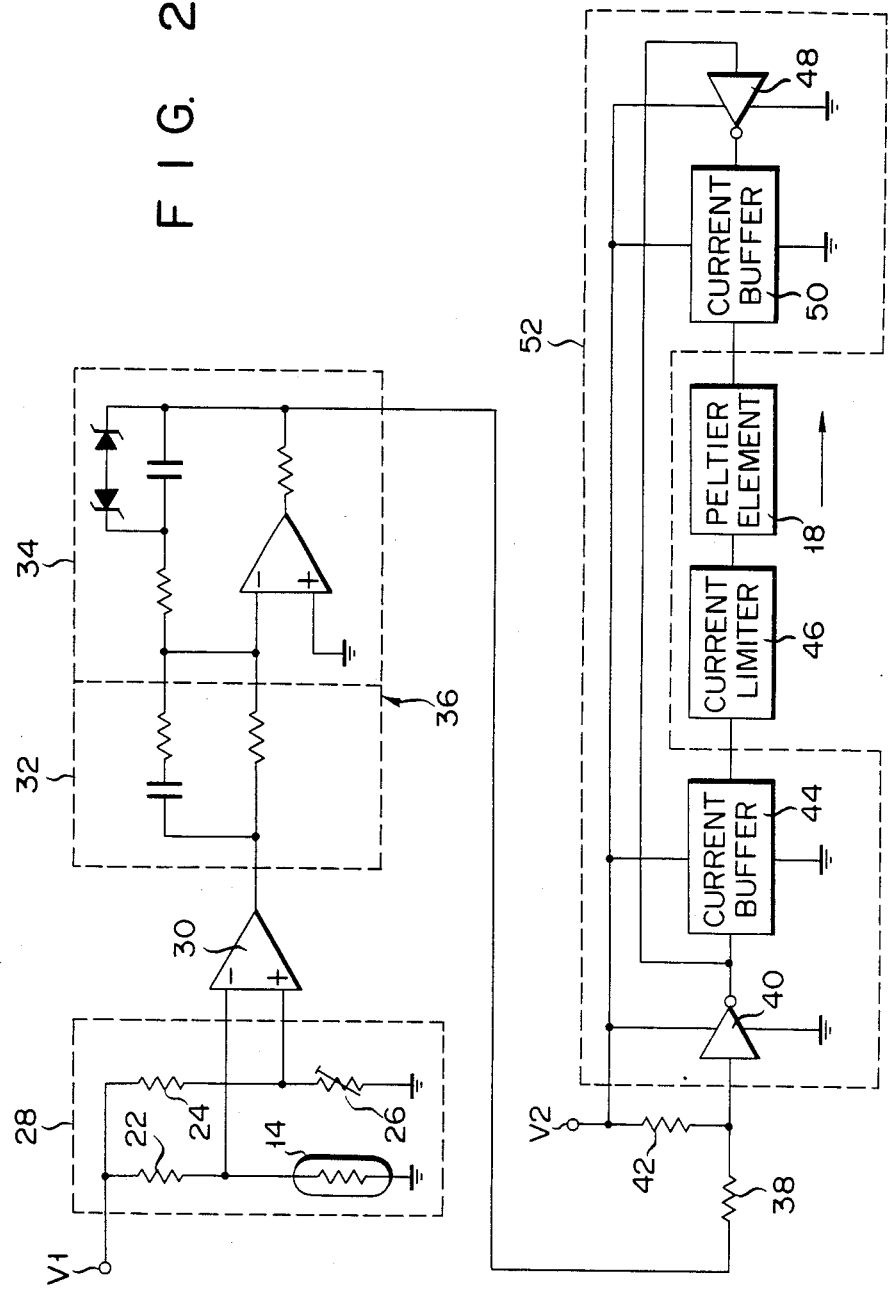
F I G. 2

TEMPERATURE CONTROL DEVICE FOR A SEMICONDUCTOR LASER

This application is a continuation of application Ser. No. 481,860, filed 4/4/83.

BACKGROUND OF THE INVENTION

The present invention relates to a temperature control device for a semiconductor laser.

Generally, the output of a semiconductor laser varies widely with variations in its temperature, even when the current is kept constant. Therefore, maintaining this output at a constant level necessitates controlling the temperature as well as the current. Conventionally, a Peltier element is used to control the temperature of the semiconductor laser. That is, when one of the metal plates of the Peltier element contacts the semiconductor laser, the polarity of the current supplied to the Peltier element is varied in accordance with the variation in temperature of the semiconductor laser. Thus, the direction of heat transmission between the Peltier element and the semiconductor laser is varied, whereby the laser is heated or cooled, with the result that the temperature thereof is kept constant. In this way, controlling the temperature of the laser using the Peltier element necessitates the provision of two types of power source: one, a power source of negative polarity, and the other, a power source of positive polarity. Conventionally, a power source ($\pm 12 \sim 15$ V) for an analog circuit section is used as a power source for the Peltier element. However, since the voltage consumed by the Peltier element is around $\pm 2$ V, using a power source having a voltage of $\pm 12 \sim 15$ V results in a voltage of $10 \sim 13$ V being uselessly consumed by heat dissipation. For this reason, the efficiency with which the power source is utilized decreases. On the other hand, since the power source voltage for a digital circuit section is as low as $+5$ V, the use of this power source makes it possible to enhance the power source efficiency. However, such a power source for a digital circuit can usually supply only a voltage of positive polarity, and so the necessity arises to provide a separate power source of negative polarity, resulting in a complicated structure.

SUMMARY OF THE INVENTION

Accordingly, the object of the invention is to provide a temperature control device which is simple in construction and which is capable of maintaining the temperature of the semiconductor laser at a constant level.

The above object is attained by a temperature control device comprising a Peltier element connected to a semiconductor laser, a detection circuit for detecting the temperature of the semiconductor laser, and a polarity control circuit for controlling, in accordance with the output of the detection circuit, the polarity of a current supplied to the Peltier element from a single power source.

BRIEF DESCRIPTION OF THE DRAWINGS

FIG. 2 is a circuit diagram showing the temperature control device according to the embodiment of the invention.

DETAILED DESCRIPTION OF THE PREFERRED EMBODIMENT

Figure 1:
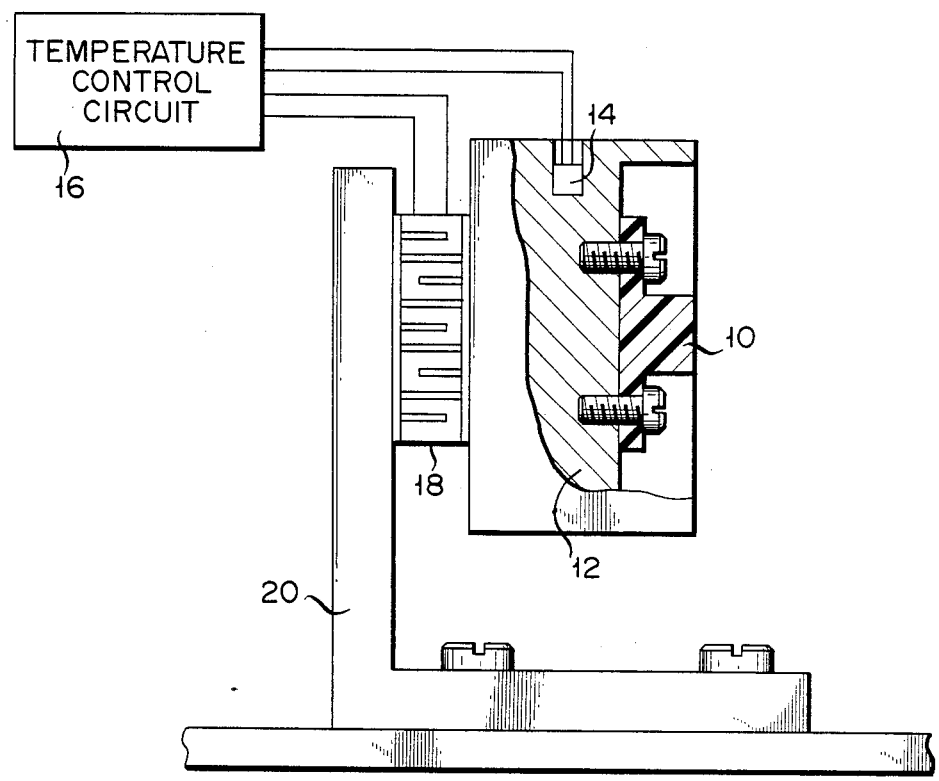
FIG. 1 is a view schematically showing a semiconductor laser equipped with a temperature control device according to an embodiment of the invention.

A temperature control device for a semiconductor laser according to an embodiment of the invention will be described with reference to the accompanying drawings. FIG. 1 is a schematic view showing the semiconductor laser equipped with the temperature control device. In FIG. 1, a semiconductor laser 10 is fixed to a base 12. A temperature sensitive resistor 14 having a negative temperature coefficient and serving as a temperature detection element, is embedded in the base 12, and its detection signal is supplied to a temperature control circuit 16. The base 12 is brought into contact with one of two metal plates of a Peltier element 18, while the other metal plate of the Peltier element 18 is made to contact a radiation board 20 made of aluminium or the like. The radiation board 20 is attached to a housing or the like (not shown). Current is supplied from the temperature control circuit 16 to the Peltier element 18, in which heat transmission is effected between the two metal plates in the direction corresponding to the polarity of the current supplied to the Peltier element 18.

FIG. 2 is a circuit diagram of the temperature control circuit 16. The negative temperature coefficient resistor 14 forms a bridge circuit 28 together with resistors 22 and 24 and a variable resistor 26. The bridge circuit 28 is connected to an analog power source V1 ($+15$ V). A balance point of the bridge circuit 28, i.e., a junction between the resistors 14 and 22, is connected to an inverting input terminal of a differential amplifier 30. A junction between the resistors 24 and 26 constituting another balance point of the bridge circuit 28 is connected to a noninverting input terminal of the differential amplifier 30. A temperature signal output of the differential amplifier 30 is supplied to an inverter 40 through a correction circuit 36 comprised of a series circuit of a differentiating circuit 32 and an integrating circuit 34. The output of integrating circuit 34 is passed through a resistor 38. The correction circuit 36 is a circuit which corrects the temperature signal according to the delay and steady-state error in the circuit. A digital power source V2 ($+5$ V) is connected to the input terminal of the inverter 40 through a resistor 42. The output signal of the inverter 40 is supplied to one of two metal plates of the Peltier element 18 through a current buffer 44 and a current limiter 46 and also supplied to the other metal plate of the Peltier element 18 through an inverter 48 and a current buffer 50. The inverters 40 and 48 and the current buffers 44 and 50 constitute a bridging amplifier 52. This bridging amplifier 52 is a circuit which controls the polarity of the current supplied to the Peltier element 18 from the power source V2, in accordance with the level of the temperature signal from the differential amplifier 30 supplied to the inverter 40 through the resistor 38.

The operation of the temperature control device according to this embodiment of the invention will now be described. The variable resistor 26 is adjusted in accordance with the setting temperature of the semiconductor laser 10. When the temperature of the semiconductor laser 10 is lower than this setting temperature, the resistance value of the negative temperature coefficient resistor 14 increases. The voltage at the junction between the resistors 22 and 14 becomes higher than that at the junction between the resistors 24 and 26. The differential amplifier 30 produces a negative temperature signal of which an absolute value is equal to that of a difference between the two input voltages to the differential amplifier 30. This temperature signal is supplied as a positive signal to the current buffer 44 through the inverter 40 and is also supplied as a negative signal to the current buffer 50 through the inverters 40 and 48. As a result, current is allowed to flow in the Peltier element 18 in a direction indicated by the arrow shown in FIG. 2. At this time, the metal plate kept in contact with the radiation board 20, of the two metal plates constituting the Peltier element 18, becomes hot, while the metal plate kept in contact with the semiconductor laser 10 becomes cool. Thus, heat is transmitted from the Peltier element 18 to the semiconductor laser 10, with the result that the laser 10 is heated.

When the temperature of the semiconductor laser 10 is higher than the setting temperature (defined by resistor 26), the resistance value of the negative temperature coefficient resistor 14 decreases. For this reason, the voltage at the junction between the resistors 22 and 14 becomes lower than that at the junction between the resistors 24 and 26. The differential amplifier 30 produces a positive temperature signal whose absolute value equals that of a difference between input voltages. At this time, current is allowed to flow in the Peltier element 18 in a direction opposite to that indicated by the arrow shown in FIG. 2. Therefore, heat is transmitted from the semiconductor laser 10 to the Peltier element 18 and then is transmitted to the radiation board 20, thereby cooling the semiconductor laser 10.

As stated above, according to this embodiment, when the temperature of the semiconductor laser 10 deviates from the setting temperature, a current of a polarity corresponding to the direction in which this deviation occurs flows through the Peltier element 18 due to the action of the bridging amplifier 52. The temperature of the laser 10 is so controlled as to approach the setting temperature. In this way, the bridging amplifier 52 makes it possible to supply a current of different polarity from the single low power source V2 to the Peltier element 18. Thus, the Peltier element can be controlled using only a simple construction. Thus, it is possible to maintain the temperature of the semiconductor laser at a constant level. Since the voltage of the single power source is set at a low level, the wasted power consumption decreases, thereby enhancing the power source efficiency. Further, since the detected temperature signal is supplied to the bridging amplifier 52 after it is subjected to the differentiating correction and integrating correction, the delay and steady-state errors in the circuit are corrected, thereby realizing stable control. Since the level of the current supplied to the Peltier element 18 is limited by the current limiter 46, the Peltier element is reliably prevented from breaking down due to an excessive supply of current. Further, owing to the existence of the bridging amplifier 52, the level of the voltage applied to the Peltier element 18 can be twice as high as that of the power source voltage (5 V), and so it is possible to double the range of control.

The present invention is not limited to the abovementioned embodiment but permits various modifications to be made. The temperature detection element may use a resistor having positive temperature characteristics. The relationship between the temperature of the semiconductor laser 10, the polarity of the output signal of the differential amplifier 30 and the characteristic of the bridging amplifier 52 does not necessarily have to be as stated above if a feed-back loop is established so as to make the temperature of the Peltier element constant.

What is claimed is:

1. A temperature control device for a semiconductor laser comprising:
    a Peltier element connected to a semiconductor laser for selectively heating or cooling the semiconductor laser during operation of said semiconductor laser dependng upon the polarity of a current supplied to said Peltier element;
    temperature detection means for detecting the temperature of the semiconductor laser during operation thereof;
    a single power source of a single given polarity for supplying a current for said Peltier element; and
    polarity control means connected between said single polarity power source and said Peltier element for controlling the polarity, from positive to negative and vice versa, of the current supplied to the Peltier element from said single polarity power source during operation of said semiconductor in accordance with the output of said detection means to thereby selectively heat and cool said semiconductor laser during operation thereof to maintain the temperature and output thereof substantially constant during operation thereof; said polarity control means comprising a bridge amplifier including a first inverter supplied with the output of said detection means and the current from said single polarity power source, a first buffer and a second inverter both supplied with the output of said first inverter, and a second buffer supplied with the output of said second inverter, said first and second buffers having respective outputs connected to said Peltier element.

2. A temperature control device according to claim 1, in which said Peltier element comprises two metal plates, one of which is connected to the semiconductor laser and the other of which is connected to a radiation board.

3. A temperature control device according to claim 1, in which said temperature detection means includes a bridge circuit having two sides and a pair of balance points, said bridge circuit having at one side thereof a temperature sensitive resistor provided in the vicinity of the semiconductor laser, and a detection circuit coupled to the bridge circuit for detecting the difference in voltage between the balance points of the bridge circuit.

4. A temperature control device according to claim 3, in which said bridge circuit comprises a variable resistor connected at one side thereof.

5. A temperature control device according to claim 4, wherein said temperature sensitive resistor is provided at one side of said bridge circuit, and said variable resistor is provided at the other side of said bridge circuit.

6. A temperature control device according to claim 5, wherein said temperature sensitive resistor has a negative temperaure coefficient.

7. A temperature control device according to claim 5, wherein said temperature sensitive resistor has a positive temperature coefficient.

8. A temperature control device according to claim 3, in which said detection circuit comprises a differential circuit.

9. A temperature control device according to claim 3, comprising a differentiating circuit and an integrating circuit coupling the output of said detection circuit to said polarity control means.

10. A temperature control device according to claim 9, wherein said differentiating circuit is connected in series with said integrating circuit.

11. A temperature control device according to claim 3, wherein said temperature sensitive resistor has a negative temperature coefficient.

12. A temperature control device according to claim 3, wherein said temperature sensitive resistor has a positive temperature coefficient.

13. A temperature control device according to claim 1, in which said polarity control means comprises a current limiter.

14. A temperature control device for a semiconductor laser, comprising:
   a Peltier element connected to a semiconductor laser for selectively heating or cooling the semiconductor laser during operartion of said semicondcutor laser depending upon the polarity of a current supplied to said Peltier element;
   temperature detection means for detecting the temperature of the semconductor laser during operation thereof;
   a single power source of a single given polarity for supplying a current to said Peltier element; and
   bridge amplifier means connected to said single power source, temperature detecting means and Peltier element for changing or not changing the polarity of the current supplied from said single power source in accordance with the output of said temperature detecting means, and for supplying this current to said Peltier element to thereby selectively heat and cool said semiconductor laser during operation thereof, substantially maintaining the temperature and output thereof at a constant level.

15. A temperature control device according to claim 14, in which said temperature detection means includes a bridge circuit having two sides and a pair of balance points, said bridge circuit having at one side thereof a temperature sensitive resistor provided in the vicinity of the semiconductor laser, and a detection circuit coupled to the bridge circuit for detecting the difference in voltage between the balance points of the bridge circuit.

16. A temperature control device according to claim 15, in which said bridge circuit comprises a variable resistor connected at one side thereof.

17. A temperature control device according to claim 15, in which said detection circuit comprises a differential circuit.

18. A temperature control device according to claim 15, wherein said temperature sensitive resistor has a negative temperature coefficient.

19. A temperature control device according to claim 15, wherein said temperature sensitive resistor has a positive temperature coefficient.

* * * * *